US006545393B2

(12) United States Patent
Iwasaki et al.

(10) Patent No.: US 6,545,393 B2
(45) Date of Patent: Apr. 8, 2003

(54) CRYSTAL UNIT

(75) Inventors: Takahiko Iwasaki, Saitama (JP); Kazuyoshi Oguri, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/223,949

(22) Filed: Aug. 20, 2002

(65) Prior Publication Data

US 2003/0048044 A1 Mar. 13, 2003

(30) Foreign Application Priority Data

Aug. 20, 2001 (JP) ........................................ 2001-248619

(51) Int. Cl.⁷ ............................................. H01L 41/053
(52) U.S. Cl. ........................................ 310/348; 310/353
(58) Field of Search .................................. 310/348, 353

(56) References Cited

U.S. PATENT DOCUMENTS

| 4,266,157 A | * | 5/1981 | Peters .......................... 310/353 |
| 4,273,399 A | * | 6/1981 | Myers et al. .................. 439/74 |
| 4,329,613 A | * | 5/1982 | Kinzel et al. ................. 310/344 |
| 4,985,655 A | * | 1/1991 | Jensik et al. ................. 310/344 |
| 5,572,082 A | * | 11/1996 | Sokol .......................... 310/366 |
| 6,300,707 B1 | * | 10/2001 | Takehana et al. ........... 310/348 |

FOREIGN PATENT DOCUMENTS

| JP | 55-651 | * | 1/1980 | ................. 310/353 |
| JP | 4-222109 | * | 8/1992 | ................. 310/348 |
| WO | WO-92/05592 | * | 4/1992 | ........... H01L/41/04 |

* cited by examiner

Primary Examiner—Thomas M. Dougherty
(74) Attorney, Agent, or Firm—Katten Muchin Zavis Rosenman

(57) ABSTRACT

A quartz crystal unit using a metallic base and improved in its shock resistance includes a circular plate-like crystal blank having first and second extending electrodes respectively extended from excitation electrodes, first and second L-letter-shaped metallic brackets electrically and mechanically connected to the first and second extending electrodes at the outer circumferential portion of the crystal blank, first and second lead wires constituted as hermetic terminals penetrating the metallic base and bonded to the first and second brackets, and third and fourth L-letter-shaped metallic brackets mechanically connected to portions of the outer circumferential portion of the crystal blank, in which the naked surface if the crystal blank is exposed. The third and fourth brackets are interconnected to form an integral metallic holding member. An arrangement for connecting the holding member to the metallic base is further provided.

9 Claims, 3 Drawing Sheets

CRYSTAL UNIT

BACKGROUND OF THE INVENTION

1. Field of the Invention

The present invention relates to a quartz crystal unit in which a quartz crystal blank is held on a metallic base, and more particularly, relates to a crystal unit improved in its shock resistance.

2. Description of the Related Art

A crystal unit is incorporated in an oscillator as a reference source for frequency, and is adopted by various kinds of telecommunication equipment. As one of these crystal units, there is a certain crystal unit employing a quartz crystal blank of AT-cut or SC-cut to increase stability.

FIGS. 1 and 2 are a cross-sectional view and a plan view, respectively, illustrating the constitution of a conventional crystal unit. Generally, a crystal unit holds crystal blank 3 above metallic base 1, and then covers metallic base 1 with a metallic cover to thereby seal crystal blank 3 in the metallic container consisting of metallic base 1 and the metallic cover. FIGS. 1 and 2 are views illustrating a state where the metallic cover is not provided.

In the illustrated crystal unit, crystal blank 3 is of substantially circular plate, and its circumferential portion is equiangularly held by four L-letter-shaped metallic brackets 2a, 2c, 2b and 2d provided on metallic base 1. Four lead wires 4a, 4c, 4b and 4d arranged to be in registration with brackets 2a, 2c, 2b and 2d are disposed so as to penetrate the base body portion of metallic base 1. In these lead wires, at least a pair of opposing lead wires 4a and 4b are provided with, at their portions penetrating the base body portion, non-illustrated glass portions by which lead wires 4a and 4b are electrically insulated from the base body portion. That is, at least the pair of opposing lead wires 4a and 4b are provided as hermetic terminals against metallic base 1.

Any one of L-letter-shaped metallic brackets 2a through 2d is provided with a vertical portion and a horizontal portion, and the horizontal portion is spot-welded by, for example, laser beam to the extreme end of each of lead wires 4a through 4d. Brackets 2a and 2b connected to lead wires 4a and 4b have their horizontal portions which extend toward the central portion of metallic base 1, and their vertical portions which are arranged on the side of the outer circumference of metallic base 1 while permitting the inner faces thereof to diametrically confront each other. Similarly, brackets 2c and 2d connected to lead wires 4c and 4d have their horizontal portions which extend toward the central portion of metallic base 1, and their vertical portions which are arranged so that the inner faces thereof diametrically confronting each other.

Crystal blank 3 of circular plate consists of, for example, a crystal blank of AT cut, and is formed with excitation electrodes 5a and 5b on both of the principal planes thereof. Further, extending electrodes 6a and 6b are provided to extend from excitation electrodes 5a and 5b toward the outer circumferential portion of crystal blank 3 in mutually opposite directions. Extending electrodes 5a and 5b are formed so as to be folded back from one to the opposite face at the edge of crystal blank 3. Further, extending electrodes 6a and 6b are electrically and mechanically connected to brackets 2a and 2b connected to lead wires 4a and 4b at positions of the end faces of crystal blank 3. In this case, a metallic foil is disposed between a portion of respective extending electrodes 6a and 6b, which appears at the end face of crystal blank 3, and the inner face of the vertical portion of each of brackets 2a and 2b, so as to be bonded there by thermocompression. In other words, the bonding is achieved by the so-called bracing. Furthermore, the vertical portions of brackets 2c and 2d are similarly bonded to the end face of crystal blank 3 by the method of bracing. Brackets 2c and 2d are not electrically connected to excitation electrodes 5a and 5b, and merely exhibit a function for holding crystal blank 3.

In this type of crystal unit, since crystal blank 3 is mechanically connected, at four positions thereof, to brackets 4a through 4d, relatively large crystal blank 3 can be stably held. Further, the end face of crystal blank 3 is used for connection, but no connecting material is attached to the principal planes thereof. Thus, a good vibration characteristic of the quartz crystal blank can be maintained. Also, since any organic material such as conductive adhesive is not employed, a good aging characteristic of the crystal unit can be ensured. From these reasons, this type of crystal unit has been suitably used for, for example, a crystal oscillator with high stability, which employs a thermostatic bath.

Nevertheless, in the above-described crystal unit, brackets 2a through 2d are connected to lead wires 4a through 4d by point connection by using the spot welding. Therefore, the strength of connection of brackets 2a through 2d to lead wires 4a through 4d is small, and accordingly when any shock by falling or the like is applied to the crystal unit, rotational moment acts about the end of each of lead wires 4a through 4d. As a result, there occurs a problem such that a stress is generated in crystal blank 3 to cause a change in the resonance frequency before and after the application of the shock.

Also, respective brackets 2a through 2d are individually connected to lead wires 4a through 4d, and thus, an operation to conduct positional alignment during the production of the crystal unit must have become rather difficult. Particularly, since it is necessary for a distance between mutually opposed brackets 2a and 2b, and a distance between mutually opposed another pair of brackets 2c and 2d to be made equal, the positional alignment takes long time to thereby bring about a reduction in fabrication performance and productivity.

SUMMARY OF THE INVENTION

An object of the present invention is to provide a crystal unit especially improved in its shock resistance.

Another object of the present invention is to provide a crystal unit capable of easily performing a positional alignment operation during the production process while maintaining the shock resistance of the crystal unit.

The above objects of the present invention can be achieved by a crystal unit, which comprises a metallic base, a crystal blank having first and second principal planes, first and second excitation electrodes respectively formed in the first and second principal planes, a first extending electrode extending on the first principal plane from the first excitation electrode in a first direction toward an outer circumferential portion of the crystal blank, a second extending electrode extending on the second principal plane from the second excitation electrode in a second direction different from the first direction toward the outer circumferential portion of said crystal blank, first and second L-letter-shaped metallic brackets respectively electrically and mechanically connected to the first and second extending electrodes at the outer circumferential portion of the crystal blank, first and second lead wires constituted as hermetic terminals penetrating the metallic base and bonded respectively to the first and second brackets, third and fourth L-letter-shaped metallic brackets mechanically connected, at positions different from connecting positions of the first and second brackets, to portions of the outer circumferential portion of the crystal blank, in which a naked surface of the crystal blank is exposed, the third and fourth brackets being interconnected to form an integral metallic holding member, and means for connecting the holding member to said metallic base.

In the present invention, since the third and fourth L-letter-shaped metallic brackets are interconnected to form the integral holding member, the third and fourth brackets are mutually secured, and therefore even if the holding member is bonded by spot welding to the ends of the two lead wires, any rotational moment generated by shock or the like is attenuated or mitigated to result in an improvement of the shock resistance of the crystal unit.

Further, in the crystal unit according to the present invention, the number of brackets, which require a positional alignment operation is substantially reduced compared with the conventional crystal unit, and therefore the operation for the positional alignment can be easier.

DETAILED DESCRIPTION OF THE INVENTION

Figure 1:
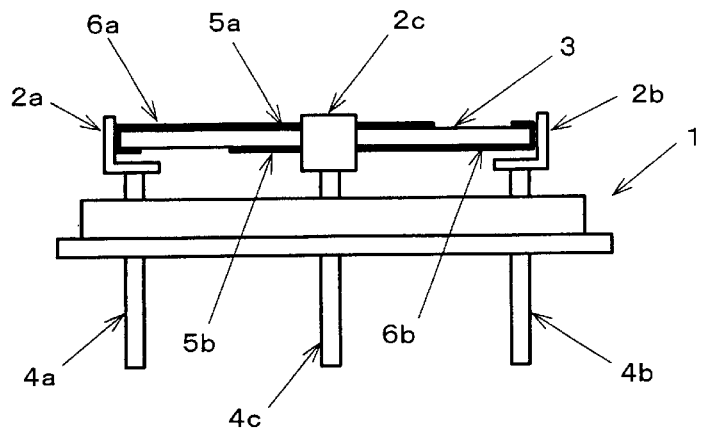
FIG. 1 is a cross-sectional view illustrating the conventional crystal unit.
Figure 2:
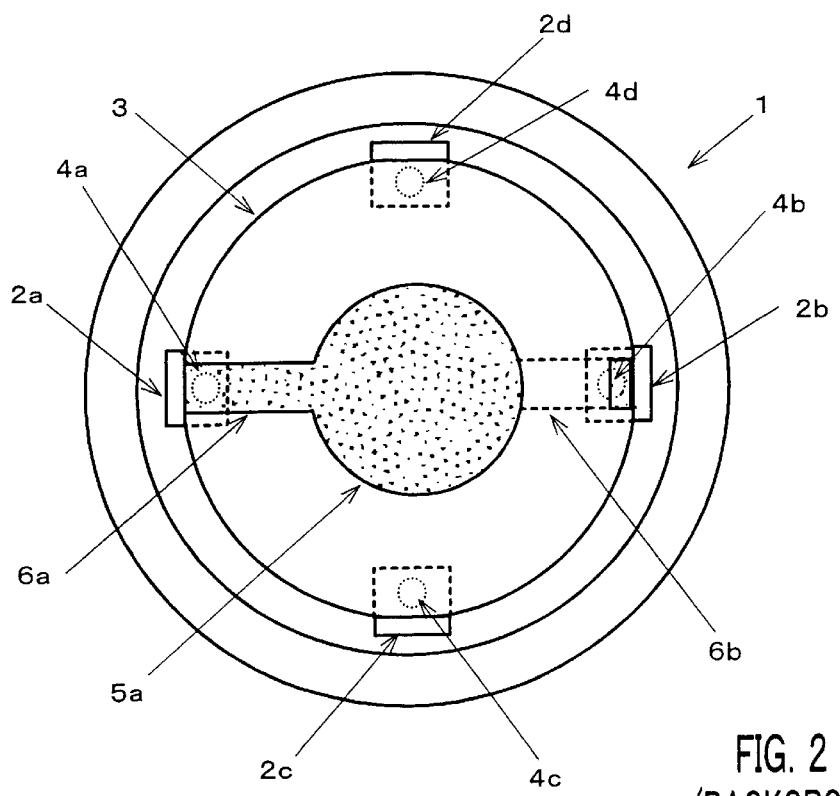
FIG. 2 is a plan view of the crystal unit shown in FIG. 1.
Figure 3:
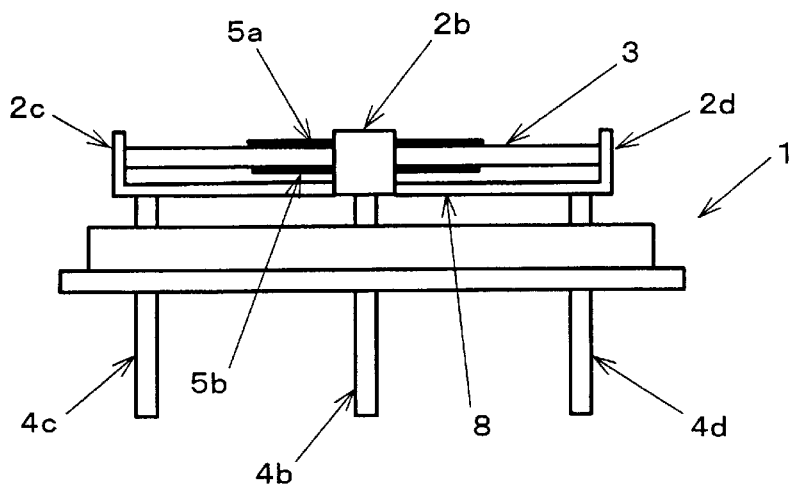
FIG. 3 is a cross-sectional view illustrating a crystal unit according to an embodiment of the present invention.
Figure 4:
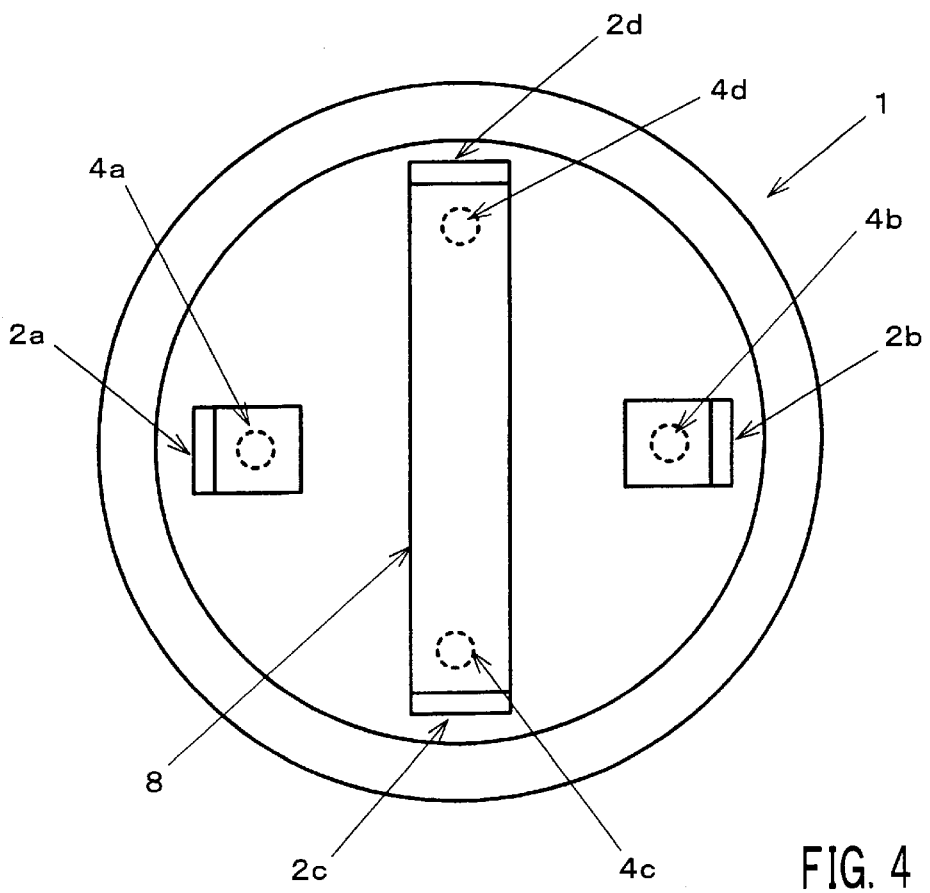
FIG. 4 is a plan view of the crystal unit shown in FIG. 3, illustrating a state where a crystal blank is removed.
Figure 5:
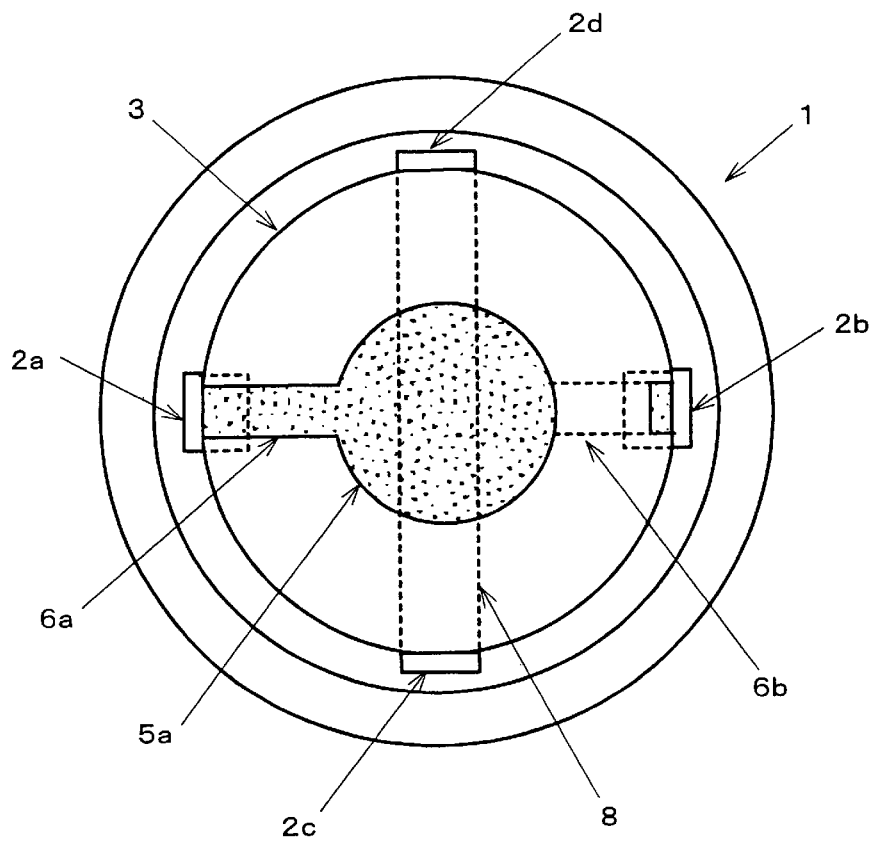
FIG. 5 is a plan view of the crystal unit shown in FIG. 3.

The quartz crystal unit according to the first embodiment of the present invention, illustrated in FIGS. 3 through 5, is similar to that illustrated in FIGS. 1 and 2 but is different in that L-letter-shaped metallic brackets 2c and 2d, i.e., those which are not connected to excitation electrodes 5a and 5b, are formed as an integral part. In FIGS. 3 to 5, the same constituents as those in FIGS. 1 and 2 are designated by the same reference numerals.

Four lead wires 4a through 4d are provided so as to penetrate the base body of metallic base 1, and at least two of them, i.e., lead wires 4a and 4b are provided as hermetic terminals. To the extreme ends of lead wires 4a through 4d, L-letter-shaped metallic brackets 2a through 2d are respectively attached by spot welding, and at four positions of the outer circumferential portion of circular plate like quartz crystal blank 3, the vertical portions of these brackets 2a through 2d are bonded by bracing to the end faces of crystal blank 3. At this stage, brackets 2a and 2b are further electrically connected to extending electrodes 6a and 6b, which are provided for crystal blank 3. On the other hand, brackets 2c and 2d are arranged in a direction perpendicular to the direction of arrangement of brackets 2a and 2b, viewing from the center of crystal blank 3, and are directly connected to the naked surface of crystal blank 3.

As described above, L-letter-shaped metallic brackets 2c and 2d are integrally formed to be mutually interconnected to thereby provide one holding member 8. Namely, a rectangular flat metallic plate is bended vertically at opposite end portions thereof, respectively, to form a generally concave-shaped member, which would be obtained by interconnecting the horizontal portions of brackets 2c and 2d, so that holding member 8 is provided. Brackets 2a and 2b electrically and mechanically connected to extending electrodes 6a and 6b are provided as individual members in a manner similar to the conventional crystal unit as shown FIG. 1.

In the described crystal unit, since brackets 2c and 2d connected only mechanically to the opposite outer circumferential portions of crystal blank 3, in which the naked end face is exposed, are interconnected to provide metallic holding member 8, the opposite ends of this holding member 8 have a mutually secured relationship. Therefore, compared with the conventional crystal unit as illustrated in FIGS. 1 and 2, occurrence of any rotational moment caused by the application of shock due to falling or the like can be suppressed in the crystal unit of the present embodiment. Hereby, any stress generating in crystal blank 3 can be attenuated, and a change in the frequency before and after the application of shock can be prevented to result in improvement of the shock resistance of the crystal unit.

Figure 6:
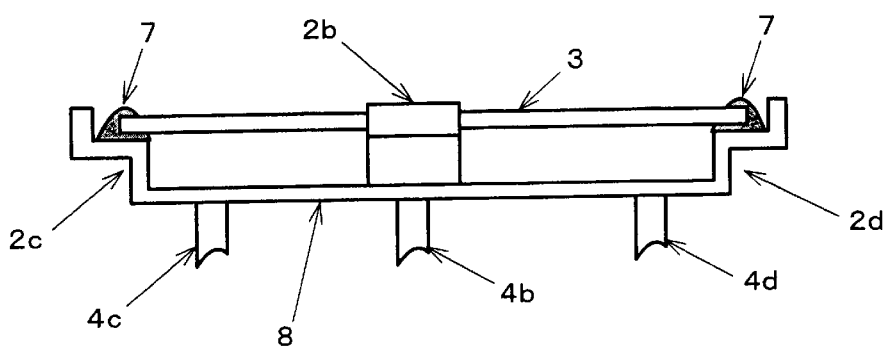
FIG. 6 is a partial cross-sectional view of a crystal unit according to another embodiment of the present invention.

In the foregoing description, although brackets 2a through 2d are bonded by bracing to the end face of crystal blank 3, the bonding may be achieved by using conductive adhesive, as typically indicated in FIG. 6. Namely, stepped portions are formed in respective vertical portions of the L-letter-shaped metallic brackets, and at these stepped portions, the outer circumferential portion of crystal blank 3 may be fixed to the brackets by adhesive 7. In this case, concerning brackets 2a and 2b, which are needed to be electrically connected to leading electrodes 6a and 6b, it is necessary for crystal blank 3 to be bonded to these brackets by conductive adhesive 7. Concerning brackets 2c and 2d, which are connected to the portions of crystal blank 3, in which the naked end face is exposed, either conductive or insulating adhesive may be used. Further, with brackets 2a and 2b, bracing may be employed for the bonding, and with the other brackets 2c and 2d, insulating adhesive or the like might be used. However, from the viewpoint of the property of aged deterioration, the bracing should be employed rather than the adhesive.

According to the above description, although holding member 8 formed as an integral member by interconnecting L-letter-shaped metallic brackets 2c and 2d, are attached to the ends of two lead wires 4c and 4d by spot welding, the holding member may be directly secured to the surface of metallic base 1 by, for example, a solder, without employment of any such lead wires 4c and 4d. In this case, substantially the entire face of holding member 8 is connected to metallic base 1, and accordingly the strength of connection can be increased.

In the foregoing description, although brackets 2a, 2c, 2b and 2d are arranged by an angular distance of approximately 90° along the outer circumference of crystal blank 3, the arrangement of the L-letter-shaped metallic brackets is not limited to the described one. For example, when a crystal blank of AT cut is employed, since a direction in which a line for tying two opposite outer end circumferential portions of the crystal blank extends, and which is inclined ±30° from the crystallographic Z-axis direction of the quartz crystal, corresponds to a direction in which the stress sensitivity of the crystal blank becomes nil, four points on the outer circumferential portion of the crystal blank may be held so that extending electrodes 6a and 6b are extended to at least one of the above-mentioned two opposite outer end circumferential portions. Alternately, as required, the crystal blank may be held at arbitrary four points thereof, which are arranged to obliquely cross one another.

Further, the described circular plate-like crystal blank may be replaced with a square plate-like crystal blank. In brief, in a crystal unit having a crystal blank held at four points on the outer circumferential portion thereof by L-letter-shaped metallic brackets, such a constitution that a pair of brackets having no relation with the electrical connection to the excitation electrodes are mutually interconnected so as to form an integral member or part belongs to the technical scope of the present invention.

What is claimed is:

1. A crystal unit comprising:
   a metallic base;
   a crystal blank having first and second principal planes;
   first and second excitation electrodes respectively formed in said first and second principal planes;
   a first extending electrode extending on said first principal plane from said first excitation electrode in a first direction toward an outer circumferential portion of said crystal blank;
   a second extending electrode extending on said second principal plane from said second excitation electrode in a second direction different from said first direction toward said outer circumferential portion of said crystal blank;
   first and second L-letter-shaped metallic brackets respectively electrically and mechanically connected to said first and second extending electrodes at said outer circumferential portion of said crystal blank;
   first and second lead wires constituted as hermetic terminals penetrating said metallic base and bonded respectively to the said first and second brackets;
   third and fourth L-letter-shaped metallic brackets mechanically connected, at positions different from connecting positions of said first and second brackets, to portions of said outer circumferential portion of said crystal blank, in which a naked surface of the crystal blank is exposed, said third and fourth brackets being interconnected to form an integral metallic holding member; and
   means for connecting said holding member to said metallic base.

2. The crystal unit according to claim 1, wherein said respective brackets are respectively provided with a horizontal portion thereof and a vertical portion thereof, said vertical portion being bonded to an end face of said outer circumferential portion of said crystal blank.

3. The crystal unit according to claim 1, wherein said crystal blank is of a circular plate, and said respective brackets are substantially equidistantly arranged along the outer circumference of said crystal blank.

4. The crystal unit according to claim 3, wherein said second direction is a direction substantially opposite to said first direction.

5. The crystal unit according to claim 2, wherein said vertical portion is bonded by bracing to said end face of said outer circumferential portion of said crystal unit.

6. The crystal unit according to claim 1, wherein said brackets are respectively provided with a horizontal portion thereof, a vertical portion thereof, and a stepped portion formed in said vertical portion, and are respectively bonded by adhesive to said outer circumferential portion of said crystal blank at said stepped portion.

7. The crystal unit according to claim 1, wherein said connecting means comprises third and fourth lead wires protruding from said metallic base at positions in registration with said third and fourth brackets, respectively.

8. The crystal unit according to claim 3, wherein said second direction is a direction substantially opposite to said first direction, wherein said first extending electrode is folded back toward said second principal plane at said outer circumferential portion of said crystal blank and wherein said second extending electrode is folded back toward said first principal plane at said outer circumferential portion of said crystal blank.

9. The crystal unit according to claim 8, wherein said brackets are respectively provided with a horizontal portion and a vertical portion, said vertical portion being bonded by bracing to said end face of said outer circumferential portion of said crystal blank.

* * * * *